United States Patent
Beck et al.

(10) Patent No.: US 6,207,727 B1
(45) Date of Patent: Mar. 27, 2001

(54) PHOTOINITIATOR MIXTURES CONTAINING ACYLPHOSPHINOXIDES AND BENZOPHENONE DERIVATIVES

(75) Inventors: Erich Beck, Ladenburg; Christof Kandzia, Wachenheim; Bernhard Prantl, Worms; Matthias Lokai, Enkenbach-Alsenborn; Peter Enenkel, Hessheim; Edmund Keil, Heuchelheim; Klaus Menzel, Ludwigshafen, all of (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 09/147,459

(22) PCT Filed: Nov. 18, 1997

(86) PCT No.: PCT/EP97/06423

§ 371 Date: Dec. 30, 1998

§ 102(e) Date: Dec. 30, 1998

(87) PCT Pub. No.: WO98/28340

PCT Pub. Date: Jul. 2, 1998

(30) Foreign Application Priority Data

Dec. 5, 1996 (DE) .............................. 196 50 562

(51) Int. Cl.[7] .............................. C08F 2/46; C08G 2/46; C08J 3/28
(52) U.S. Cl. .............................. 522/64; 522/7; 522/28; 522/30; 526/328; 526/208; 526/100; 526/138
(58) Field of Search .............................. 522/64, 30, 28, 522/6, 7; 526/100, 111, 138, 145, 208, 328

(56) References Cited

U.S. PATENT DOCUMENTS 5,162,390 * 11/1992 Tilley et al. .......................... 522/64
5,218,009 * 6/1993 Rutsch et al. .......................... 522/16
5,449,702 * 9/1995 Tayama et al. .......................... 522/4
5,472,992 * 12/1995 Leppard et al. .......................... 522/18
5,534,559 * 7/1996 Leppard et al. .......................... 522/64
5,767,169 * 6/1998 Leppard et al. .......................... 522/64
5,942,290 * 8/1999 Leppard et al. .......................... 427/510

FOREIGN PATENT DOCUMENTS 0 007 086  7/1979  (EP) .
0 007 508  2/1980  (EP) .
0 073 413  3/1983  (EP) .
0 446 175  2/1991  (EP) .
0 513 781  11/1992  (EP) .

* cited by examiner

*Primary Examiner*—James J. Seidleck
*Assistant Examiner*—Sanza L. McClendon
(74) *Attorney, Agent, or Firm*—Oblon, Spivak, McClelland, Maier & Neustadt, P.C.

(57) ABSTRACT

A photoinitiator mixture comprising
a) at least one acyl- or diacylphosphine oxide of the formula I

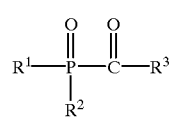

and
b) at least one benzophenone derivative of the formula II

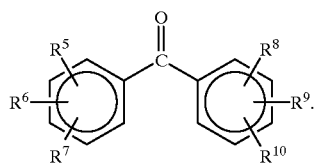

6 Claims, No Drawings

PHOTOINITIATOR MIXTURES CONTAINING ACYLPHOSPHINOXIDES AND BENZOPHENONE DERIVATIVES

The invention relates to a photoinitiator mixture comprising a) at least one acyl- or diacylphosphine oxide of the formula I

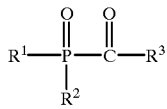

where
- $R^1$ is $C_1$–$C_{18}$-alkyl, halogen- or $C_1$–$C_6$-alkoxy-substituted $C_1$–$C_4$-alkyl, $C_5$–$C_8$-cycloalkyl, $C_7$–$C_9$-phenylalkyl, phenyl, naphthyl, biphenylyl, mono- or poly-halogen-, —$C_1$–$C_{12}$-alkyl- and/or —$C_1$–$C_{12}$-alkoxy-substituted phenyl, naphthyl or biphenylyl, or a monovalent, N-, O- or S-containing, 5- or 6-membered heterocyclic radical,
- $R^2$ is phenyl, naphthyl, biphenylyl, mono- or poly-halogen-, —$C_1$–$C_{12}$-alkyl and/or —$C_1$–$C_{12}$-alkoxy-substituted phenyl, naphthyl or biphenylyl, a monovalent, N-, O- or S-containing, 5- or 6-membered heterocyclic radical, $C_1$–$C_{18}$-alkoxy, phenoxy, halogen-, $C_1$–$C_4$-alkyl or $C_1$–$C_4$-alkoxy-substituted phenoxy, benzyloxy, cyclohexyloxy or a group —CO—$R^4$, or $R^2$ and $R^1$ together with the phosphorus form a ring,
- $R^3$ is $C_1$–$C_{18}$-alkyl, halogen- or $C_1$–$C_6$-alkoxy-substituted $C_1$–$C_4$-alkyl, $C_5$–$C_8$-cycloalkyl, $C_7$–$C_9$-phenylalkyl, phenyl, naphthyl, biphenylyl, mono- or poly-halogen-, —$C_1$–$C_{12}$-alkyl and/or —$C_1$–$C_{12}$-alkoxy-substituted phenyl, naphthyl or biphenylyl, a monovalent N-, O- or S-containing, 5- or 6-membered heterocyclic radical or a group

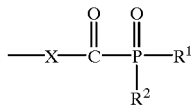

where X is $C_2$–$C_8$-alkylene, cyclohexylene or unsubstituted or halogen-, $C_1$–$C_4$-alkyl- or $C_1$–$C_4$-alkoxy-substituted phenylene or biphenylene, and

- $R^4$ is $C_1$–$C_{18}$-alkyl, halogen- or $C_1$–$C_4$-alkoxy-substituted $C_1$–$C_4$-alkyl, $C_5$–$C_8$-cycloalkyl, $C_7$–$C_9$-phenylalkyl, phenyl, naphthyl, biphenylyl, mono- or poly-halogen-, —$C_1$–$C_{12}$-alkyl- and/or —$C_1$–$C_{12}$-alkoxy-substituted phenyl, naphthyl or biphenylyl or a monovalent, N-, O- or S-containing, 5- or 6-membered heterocyclic radical, or $R^4$ and $R^3$ together are $C_2$–$C_{12}$-alkylene, vinylene or o-phenylene, and b) at least one benzophenone derivative of the formula

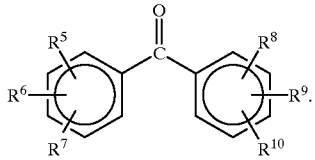

where $R^5$, $R^6$ and $R^7$ independently are $C_1$–$C_{12}$-alkyl, $C_1$–$C_4$-alkylthio, $C_1$–$C_4$-alkoxy, halogen or $C_2$–$C_6$-alkoxycarbonyl and $R^8$, $R^9$ and $R^{10}$ are hydrogen, $C_1$–$C_{12}$-alkyl, $C_1$–$C_4$-alkoxy, halogen or $C_2$–$C_6$-alkoxycarbonyl or $C_1$–$C_4$-alkylthio or a mixture of benzophenone derivatives of the formula II with other benzophenone derivatives.

The invention additionally relates to radiation-curable compositions comprising the photoinitiator mixtures.

Acylphosphine oxides and their use as photoinitiators are known, for example, from EP-A-7508 or EP-A-7086.

Photoinitiator mixtures comprising acylphosphine oxides and benzophenones have already been described in EP-A-446 175.

A large number of requirements are placed on photoinitiators used in radiation-curable compositions. Of particular importance is a high level of reactivity of the photoinitiators, by which is meant, firstly, rapid curing and, secondly, curing which even in thick coats extends down to the lower layers.

A disadvantage of prior art radiation-curable compositions is in many cases the inhibition of curing as caused by atmospheric oxygen.

There are in principle performance advantages with liquid photoinitiators, which are easier to mix with the—generally liquid—radiation-curable compounds. Another requirement is to avoid the odor nuisance often associated with prior art photoinitiators.

It is an object of the present invention, therefore, to provide photoinitiators which go a particularly long way toward meeting the above requirements.

We have found that this object is achieved by the photoinitiator mixtures defined at the outset and by their use in radiation-curable compositions.

The novel photoinitiator mixture comprises at least one acyl- or diacylphosphine oxide of the formula I (constituent a) of the mixture).

The preferred definitions of $R^1$ to $R^4$ are as follows.

$R^1$: $C_1$–$C_{18}$-alkyl; phenyl; $C_7$–$C_9$-phenylalkyl; mono- or poly-halogen-, —$C_1$–$C_{12}$-alkyl- and/or —$C_1$–$C_{12}$-alkoxy-substituted phenyl $R^2$: $C_1$–$C_{18}$-alkoxy; phenoxy; halogen-, $C_1$–$C_4$-alkyl- or $C_1$–$C_4$-alkoxy-substituted phenoxy; benzyloxy; phenyl; mono- or poly-halogen-, —$C_1$–$C_{12}$-alkyl- and/or —$C_1$–$C_{12}$-alkoxy-substituted phenyl;

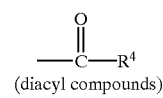
(diacyl compounds)

$R^3$: $C_1$–$C_{18}$-alkyl; $C_7$–$C_9$-phenylalkyl; phenyl; mono- or poly-halogen-, —$C_1$–$C_{12}$-alkyl- and/or —$C_1$–$C_{12}$-alkoxy-substituted phenyl $R^4$: $C_1$–$C_{18}$-alkyl; phenyl; $C_7$–$C_9$-phenylalkyl; mono- or poly-halogen-, —$C_1$–$C_{12}$-alkyl- and/or —$C_1$–$C_{12}$-alkoxy-substituted phenyl Particularly preferred definitions of $R^1$ to $R^4$ are:

$R^1$: phenyl, $C_2$–$C_{12}$-alkyl, for example isoamyl $R^2$: Phenyl, phenoxy, $C_2$–$C_{12}$-alkoxy, especially ethoxy, n-propoxy, isopropoxy, n-butoxy, isobutoxy, pentoxy, cyclohexyloxy or —CO—$R^4$ $R^3$: di- or tri-halogen-, —$C_1$–$C_{12}$-alkyl- or —$C_1$–$C_{12}$-alkoxy-substituted phenyl, substituted preferably in positions 2 and 4 or positions 2, 4 and 6 respectively.

Examples of particularly suitable radicals $R^3$ are

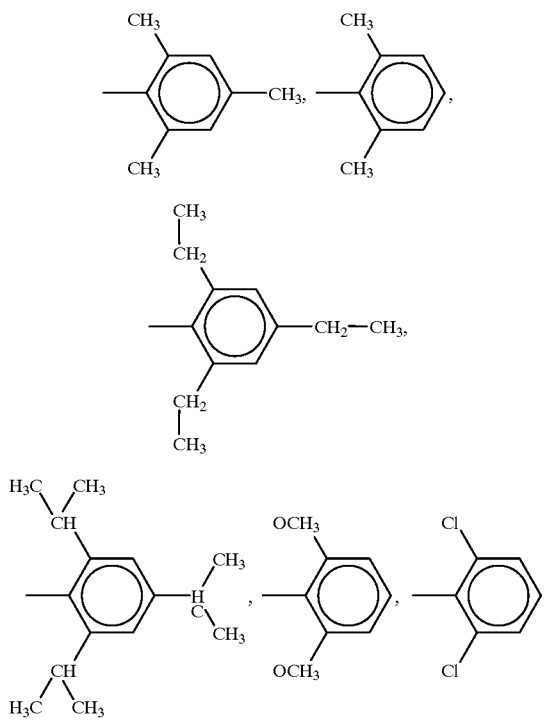

$R^4$: as for $R^3$

Halogen substituents mentioned above or below in this application are preferably Cl or Br, particularly preferably Cl.

Very particularly preferred compounds are:

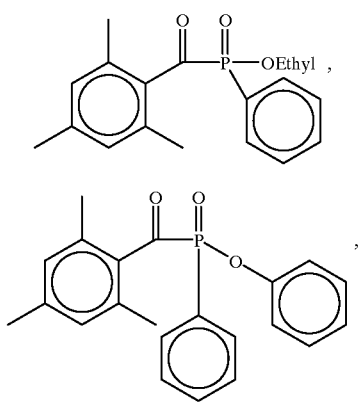

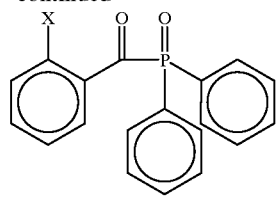

X = Cl
O-alkyl, or
alkyl
(having preferably in each case 1–8 C atoms)

and especially

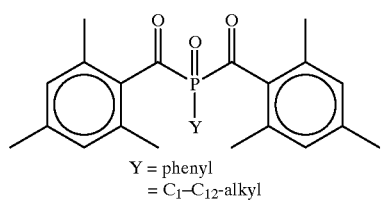

Y = phenyl
= $C_1$–$C_{12}$-alkyl and

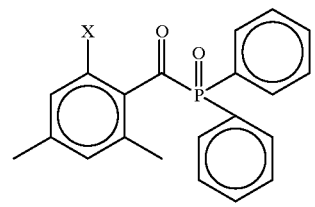

Constituent b) of the novel mixture is a benzophenone derivative of the formula II or a mixture of a benzophenone derivative of the formula II with other benzophenone derivatives.

The preferred definitions of $R^5$ to $R^{10}$ are:

$R^5, R^6, R^7$: independently $C_1$–$C_{12}$-alkyl, especially $C_1$–$C_4$-alkyl, particularly preferably methyl. Substitution is preferably in positions 2, 4 and 6 (carbonyl substitution in position 1)

$R^8, R^9, R^{10}$: independently hydrogen or $C_1$–$C_{12}$-alkyl, especially $C_1$–$C_4$-alkyl. With particular preference at least one, preferably at least two, of $R^8$, $R^9$ and $R^{10}$ is or are hydrogen and the other(s) is(are) hydrogen or $C_1$–$C_4$-alkyl, especially methyl.

In a preferred embodiment the benzophenone derivatives b) comprise a mixture of the benzophenone derivatives of the formula II with other benzophenone derivatives, especially those of the formula III,

III

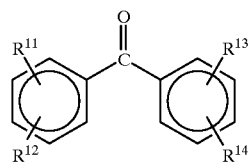

where $R^{11}$, $R^{12}$, $R^{13}$ and $R^{14}$ independently are hydrogen, $C_1$–$C_{12}$-alkyl, $C_1$–$C_4$-alkoxy, $C_1$–$C_4$-alkylthio, halogen or $C_2$–$C_6$-alkoxycarbonyl.

With preference, $R^{11}$, $R^{12}$, $R^{13}$ and $R^{14}$ independently are hydrogen or $C_1$–$C_{12}$-alkyl, especially $C_1$–$C_4$-alkyl, or methyl. With preference, at least 2 of the radicals $R^{11}$, $R^{12}$, $R^{13}$ and $R^{14}$ are hydrogen and the others are hydrogen or the above alkyl.

A particularly preferred mixture of benzophenone derivatives b) is a mixture of

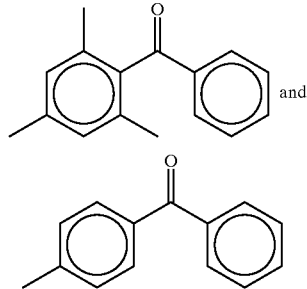

and which is sold as TZT® by Fratelli Lamberti.

The mixture of benzophenone derivatives b) consists preferably of

| from 10 to 90 | % by weight, particularly preferably |
| from 50 to 85 | % by weight, of benzophenone derivatives of the formula II and preferably of |
| from 90 to 10 | % by weight, particularly preferably |
| from 15 to 50 | % by weight, of other benzophenone derivatives, especially benzophenone derivatives of the formula III, based on the overall amount of benzophenone derivatives b) |

The content of the acyl- or diacylphosphine oxides a) and of the benzophenone derivatives b) is preferably

| from 0.5 to 99.5 | % by weight, particularly preferably |
| from 0.5 to 40 | % by weight and, with very particular preference, |
| from 5 to 30 | % by weight of compound a) and |
| from 0.5 to 99.5 | % by weight, particularly preferably |
| from 60 to 99.5 | % by weight and, with very particular preference, |
| from 70 to 95 | % by weight of compound b), based on the sum of a) + b). |

The novel photoinitiator mixture can be simply prepared by mixing the compounds a) and b) in either order.

The novel photoinitiator mixture is used in particular as a photoinitiator for the radiation curing of free-radically polymerizable, ethylenically unsaturated compounds.

The composition comprising the novel photoinitiator mixture and at least one polymerizable, ethylenically unsaturated compound is also referred to below as radiation-curable composition.

Suitable radiation-curable, free-radically polymerizable compounds are those having only one ethylenically unsaturated, copolymerizable group (compounds A).

Examples are $C_1$–$C_{20}$-alkyl (meth)acrylates, vinylaromatic compounds having up to 20 carbons, vinylesters of carboxylic acids containing up to 20 carbons, ethylenically unsaturated nitrites, vinyl ethers of $C_1$–$C_{10}$-alcohols, and aliphatic hydrocarbons having 2 to 8 carbons and 1 or 2 double bonds.

Preferred alkyl (meth)acrylates are those with $C_1$–$C_{10}$-alkyl, such as methyl methacrylate, methyl acrylate, n-butyl acrylate, ethyl acrylate and 2-ethylhexyl acrylate.

Mixtures of the alkyl (meth)acrylates are also particularly suitable.

Examples of vinyl esters of carboxylic acids having 1 to 20 carbons are vinyl laurate, stearate, propionate and acetate.

Examples of vinylaromatic compounds are vinyltoluene, α-butylstyrene, 4-n-butylstyrene, 4-n-decylstyrene and, preferably, styrene.

Examples of nitrites are acrylonitrile and methacrylonitrile.

Examples of suitable vinyl ethers are vinyl methyl ether, vinyl isobutyl ether, vinyl hexyl ether and vinyl octyl ether.

Nonaromatic hydrocarbons having 2 to 8 carbons and one or two olefinic double bonds are butadiene, isoprene, and also ethylene, propylene and isobutylene.

Preferred radiation-curable, free-radically polymerizable compounds are those having two or more polymerizable, ethylenically unsaturated groups (compounds B).

Compounds B) are, in particular, (meth)acrylate compounds, preference being given in each case to the acrylate compounds, in other words the derivatives of acrylic acid.

Preferred (meth)acrylate compounds B) contain 2 to 20, preferably 2 to 10 and, with very particular preference, 2 to 6 copolymerizable, ethylenically unsaturated double bonds.

The number-average molecular weight $M_n$ of the (meth)acrylate compounds B) is preferably below 15,000, particularly preferably below 5000 and, with very particular preference, below 3000 g/mol and more than 180 g/mol (as determined by gel permeation chromatography with polystyrene as standard and tetrahydrofuran as eluent).

(Meth)acrylate compounds are (meth)acrylates, and especially acrylates of polyfunctional alcohols, in particular those which other than the hydroxyls include no other functional groups, or only ether groups if any. Examples of such alcohols are diols such as ethylene glycol and propylene glycol, and their more highly condensed counterparts, such as diethylene glycol, triethylene glycol, dipropylene glycol, tripropylene glycol, etc., butanediol, pentanediol, hexanediol, neopentyl glycol, alkoxylated phenolic compounds, such as ethoxylated and/or propoxylated bisphenols, cyclohexanedimethanol, trifunctional and higher polyfunctional alcohols, such as glycerol, trimethylolpropane, butanetriol, trimethylolethane, pentaerythritol, ditrimethylolpropane, dipentaerythritol, sorbitol and mannitol, and the corresponding alkoxylated alcohols, especially ethoxylated and propoxylated alcohols.

The alkoxylation products are obtainable conventionally by reacting the above alcohols with alkylene oxides, especially ethylene oxide or propylene oxide. The degree of alkoxylation per hydroxyl is preferably from 0 to 10; in other words, 1 mol of hydroxyl can preferably be alkoxylated with up to 10 mol of alkylene oxides.

Other (meth)acrylate compounds are polyester (meth)acrylates, which are the (meth)acrylic esters of polyesterols.

Examples of suitable polyesterols are those which can be prepared by esterifying polycarboxylic acids, preferably dicarboxylic acids, with polyols, preferably diols. The starting materials for such hydroxyl-containing polyesters are familiar to the skilled worker. Preferred dicarboxylic acids used are succinic, glutaric, adipic, sebacic and o-phthalic acid, the isomers and hydrogenation products thereof, and also esterifiable derivatives, such as anhydrides or dialkyl esters of said acids. Suitable polyols are the abovementioned alcohols, preferably ethylene glycol, 1,2- and 1,3-propylene glycol, 1,4-butanediol, 1,6-hexanediol, neopentyl glycol, cyclohexanedimethanol, and also polyglycols of the ethylene glycol and propylene glycol types.

Polyester (meth)acrylates can be prepared in two or more stages or else in a single stage, as described for example in EP 279 303, from acrylic acid, polycarboxylic acid, polyol.

Other examples of compounds a) are epoxy or urethane (meth)acrylates.

Examples of epoxy (meth)acrylates are those obtainable by reacting epoxidized olefins or poly- and/or mono- or diglycidyl ethers, such as bisphenol A diglycidyl ether, with (meth)acrylic acid.

The reaction is familiar to the skilled worker and is described, for example, in R. Holmann, U.V. and E.B. Curing Formulation for Printing Inks and Paints, London 1984.

In the case of urethane (meth)acrylates the products involved are in particular those of the reaction of hydroxyalkyl (meth)acrylates with poly- and/or diisocyanates (see again R. Holmann, loc. cit.)

It is of course also possible to employ mixtures of different compounds B), including in particular mixtures of the above (meth)acrylic compounds.

Further examples of radiation-curable compounds B) are polyester resins, which essentially consist of polyols, especially diols, and polycarboxylic acids, especially dicarboxylic acids, one of the esterification components including a copolymerizable, ethylenically unsaturated group. Examples of such components are maleic or fumaric acid or maleic anhydride.

Preferred radiation-curable compounds are the (meth) acrylate compounds B).

Compounds B) are often used in a mixture with compounds A) which act, for example, as reactive diluents.

Preferred radiation-curable compositions comprise at least 40% by weight, with particular preference at least 60% by weight, of the compounds B), especially the (meth) acrylic compounds B), based on the overall amount of compounds A)+B).

The radiation-curable compositions preferably comprise from 0.05 to 15, particularly preferably from 0.1 to 7 and, with very particular preference, from 0.1 to 5 parts by weight of the novel photoinitiator mixture, based on 100 parts by weight of the polymerizable, ethylenically unsaturated compounds (compounds A)+B)).

The radiation-curable compositions can advantageously comprise amino compounds, which act as accelerators.

These can be primary, secondary or tertiary amine compounds. Primary or secondary amino compounds undergo a Michael addition reaction with, for example, the double bonds of the (meth)acrylic compounds B).

The content of amino compounds is preferably from 0.01 to 3 parts by weight of nitrogen, particularly preferably from 0.05 to 1 part by weight of nitrogen, based on 100 parts by weight of radiation-curable compounds A)+B).

The radiation-curable compositions can, for example, comprise pigments, dyes, leveling assistants, stabilizers, further photoinitiators, etc. In the case of pigmented, radiation-curable compositions the advantages of the novel photoinitiator mixture are particularly in evidence.

Examples of further, additional photoinitiators which can be used are anthraquinone and derivatives thereof, for example β-methylanthraquinone or tert-butylanthraquinone, or benzoins.

The pigment content can be from 5 to 70 parts by weight, for example, preferably from 10 to 50 parts by weight, based on 100 parts by weight of radiation-curable compounds A)+B).

The radiation-curable compositions can be used as coating compositions, for example as a paint or printing ink, or to produce moldings, for example printing plates, photoresists or relief forms.

The photopolymerizable compositions can also be used as filling or knifing compounds. Particularly suitable for this utility are the abovementioned compositions based on unsaturated polyesters or (poly)epoxy (meth)acrylates.

A further possible use comprises dental compositions, for example as dental filling compositions or dental prostheses.

The radiation-curable compositions are cured in particular by irradiation with UV light.

Examples of suitable radiation sources are low-pressure, medium-pressure and high-pressure mercury lamps and also fluorescent tubes, pulsed radiators, metal halide radiators, electronic flash devices and excimer radiators.

The novel, radiation-curable compositions cure well and rapidly on irradiation. Even thick or pigmented coatings can readily be cured down to the lower layers.

The novel photoinitiator mixture does not cause any odor nuisance. It is generally liquid and therefore easy to handle, and in particular is easy to mix with, for example, liquid compounds A) and B). A particular advantage in the context, for example, of the storage of the novel photoinitiator mixture is its stability even at low temperatures of down to −50° C. At these low temperatures, no separation, crystallization or agglomeration is observed.

EXAMPLES

I. Photoinitiator consistency:

The photoinitiator mixtures were prepared at room temperature by stirring the components for about 10 hours. The liquid mixtures were stored at 5° C. and −20° C. and examined for stability, viz. for changes in consistency such as separation and solidification for example. Changes in consistency would make processing (blending, application) more difficult (additional melting step) or might even prevent it completely.

| Photoinitiator mixture | Proportion | State at 23° C. | Stability of the liquids at 5° C. | Stability of the liquids at −20° C. |
|---|---|---|---|---|
| Comparison Examples: | | | | |
| Benzophenone | 100% | Solid | | |
| 2-Methylbenzophenone | 100% | | | |
| 3-Methylbenzophenone | 100% | | | |
| 4-Methylbenzophenone | 100% | | | |
| 2,4,6-Trimethylbenzophenone | 100% | | | |

| Photoinitiator mixture | Proportion | State at 23° C. | Stability of the liquids at 5° C. | Stability of the liquids at −20° C. |
|---|---|---|---|---|
| Mixture 2,4,6-trimethyl-benzophenone/4-methyl-benzophenone | 80%/20% | Liquid | >3 Weeks | >3 Weeks |
| TPO[1] | 100% | Solid | | |
| TEPO[2] | 100% | Liquid | >3 Weeks | >3 Weeks |
| Benzophenone/TPO | 80%/20% | Solid | | |
| Examples in accordance with the invention: | | | | |
| Mixture[3]/TPO | 90%/10% | Liquid | >3 Weeks | >3 Weeks |
| Mixture/TPO | 80%/20% | Liquid | >3 Weeks | >3 Weeks |
| Mixture/TEPO | 80%/20% | Liquid | >3 Weeks | >3 Weeks |
| Mixture/TEPO | 60%/40% | Liquid | >3 Weeks | >3 Weeks |

[1]TPO = 2,4,6-Trimethylbenzoyldiphenylphosphine oxide
[2]TEPO = 2,4,6-Trimethylbenzoylethoxyphenylphosphine oxide
[3]Mixture: Mixture of 2,4,6-trimethylbenzophenone and 4-methylbenzophenone in the proportion 80% by weight/20% by weight.

The novel mixtures of alkylbenzophenones and acylphosphine oxides can be processed as liquids at room temperature and also at low temperatures, although the starting components themselves are solid at room temperature.

II Clearcoat testing:

The photoinitiators (3 parts) were blended with 100 parts of an amine-modified polyether acrylate (viscosity at 23° C.: 600 mPas)—Laromer® PO 84 F (BASF AG).

The parameter tested was the cure rate, as the rate at which a liquid coating film, applied to white paper, can be conveyed on a belt beneath an undoped high-pressure mercury lamp (output: 120 W/cm of lamp length; distance of lamp from substrate 12 cm) to give a coating which adheres and which is resistant to scratching with the finger nail. The liquid coating films were applied using a 100 μm spiral doctor blade.

| Photoinitiator mixture | Proportion | Belt speed at 100 μm film thickness, m/min |
|---|---|---|
| Comparison Examples: | | |
| Benzophenone | 100% | 15 |
| 2,4,6-Trimethylbenzophenone/4-methylbenzophenone (mixture) | 80%/20% | 15 |
| TPO | 100% | 3 |
| TEPO | 100% | 3 |
| Benzophenone/TPO | 80:20 | 45 |
| Examples in accordance with the invention: | | |
| Mixture/TPO | 80:20 | 35 |
| Mixture/TEPO | 80:20 | 35 |

Pigmented coating testing:

The photoinitiators (3 parts) were blended with a mixture of 90 parts of an amine-modified polyether acrylate (viscosity at 23° C.: 600 mPas)—Laromer® PO 84 F (BASF AG) and 10 parts of anatase. The parameter determined was the curable coat thickness. For this purpose the coating material, placed in a vessel about 1 cm deep, was irradiated at a belt speed of 5 m/min. The cured layer was washed with ethyl acetate and its thickness was measured.

| Photoinitiator mixture | Proportion | Curable coat thickness (μm) |
|---|---|---|
| Comparison Examples: | | |
| Benzophenone | 100% | 79 |
| 2,4,6-Trimethyl-phenone/4-methylbenzophenone | 80:20 | 174 |
| TPO | 100% | 294 |
| TEPO | 100% | 301 |
| Benzophenone/TPO | 80:20 | 290 |
| Examples in accordance with the invention: | | |
| Mixture/TPO | 80:20 | 298 |
| Mixture/TEPO | 80:20 | 295 |

Result:

The coat thicknesses of the coating materials comprising the novel photoinitiator mixtures are comparable with those of systems comprising acylphosphine oxides as sole initiator, in larger proportions, and are higher than the thicknesses which can be achieved with benzophenones.

Overall result:

The novel mixtures of acylphosphine oxides with alkylbenzophenones, even at relatively low storage temperatures, give liquid mixtures, which are easier to process than solids. Properties such as cure rate and curable coat thickness are equal to or better than those of the starting components.

We claim:

1. A photoinitiator mixture comprising
   a) at least one acyl- or diacylphosphine oxide of the formula I

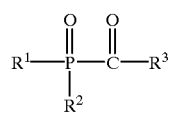

where
R[1] is $C_1$–$C_{18}$-alkyl, halogen- or $C_1$–$C_6$-alkoxy-substituted $C_1$–$C_4$-alkyl, $C_5$–$C_8$-cycloalkyl, $C_7$–$C_9$- phenylalkyl, phenyl, naphthyl, biphenylyl, mono- or poly-halogen-, —C$_1$–C$_{12}$-alkyl- and/or —C$_1$–C$_{12}$-alkoxy-substituted phenyl, naphthyl or biphenylyl, or a monovalent, N-, O- or S-containing, 5- or 6-membered heterocyclic radical, R$^2$ is phenyl, naphthyl, biphenylyl, mono- or poly-halogen-, —C$_1$–C$_{12}$-alkyl and/or —C$_1$–C$_{12}$-alkoxy-substituted phenyl, naphthyl or biphenylyl, a monovalent, N-, O- or S-containing, 5- or 6-membered heterocyclic radical, C$_1$–C$_{18}$-alkoxy, phenoxy, halogen-, C$_1$–C$_4$-alkyl or C$_1$–C$_4$-alkoxy-substituted phenoxy, benzyloxy, cyclohexyloxy or a group —CO—R$^4$, or R$^2$ and R$^1$ together with the phosphorus form a ring, R$^3$ is C$_1$–C$_{18}$-alkyl, halogen- or C$_1$–C$_6$-alkoxy-substituted C$_1$–C$_4$-alkyl, C$_5$–C$_8$-cycloalkyl, C$_7$–C$_9$-phenylalkyl, phenyl, naphthyl, biphenylyl, mono- or poly-halogen-, —C$_1$–C$_{12}$-alkyl and/or —C$_1$–C$_{12}$-alkoxy-substituted phenyl, naphthyl or biphenylyl, a monovalent N-, O- or S-containing, 5- or 6-membered heterocyclic radical or a group

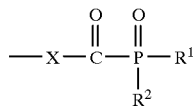

where X is C$_2$–C$_8$-alkylene, cyclohexylene or unsubstituted or halogen-, C$_1$–C$_4$-alkyl- or C$_1$–C$_4$-alkoxy-substituted phenylene or biphenylene, and R$^4$ is C$_1$–C$_{18}$-alkyl, halogen- or C$_1$–C$_4$-alkoxy-substituted C$_1$–C$_4$-alkyl, C$_5$–C$_8$-cycloalkyl, C$_7$–C$_9$-phenylalkyl, phenyl, naphthyl, biphenylyl, mono- or poly-halogen-, —C$_1$–C$_{12}$-alkyl- and/or —C$_1$–C$_{12}$-alkoxy-substituted phenyl, naphthyl or biphenylyl or a monovalent, N-, O- or S-containing, 5- or 6-membered heterocyclic radical, or R$^4$ and R$^3$ together are C$_2$–C$_{12}$-alkylene, vinylene or o-phenylene, and b) at least one benzophenone derivative of the formula

II

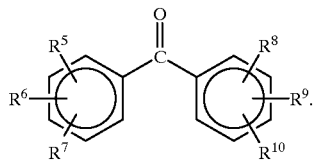

where R$^5$, R$^6$ and R$^7$ independently are C$_1$–C$_{12}$-alkyl, C$_1$–C$_4$-alkylthio, C$_1$–C$_4$-alkoxy, halogen or C$_2$–C$_6$-alkoxycarbonyl and R$^8$, R$^9$ and R$^{10}$ are hydrogen, C$_1$–C$_{12}$-alkyl, C$_1$–C$_4$-alkoxy, halogen or C$_2$–C$_6$-alkoxycarbonyl or C$_1$–C$_4$-alkylthio or a mixture of benzophenone derivatives of the formula II with other benzophenone derivatives.

2. A photoinitiator mixture as claimed in claim 1, where the proportion of the acyl- or diacylphosphine oxides a) is from 0.5 to 99.5% by weight and that of the benzophenone derivatives b) is from 99.5 to 0.5% by weight, based on the sum a)+b).

3. A photoinitiator mixture as claimed in claim 1, where the benzophenone derivatives b) are a mixture of benzophenone derivatives of the formula II and benzophenone derivatives of the formula

III

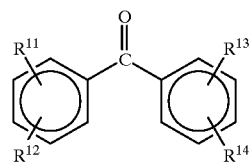

where R$^{11}$, R$^{12}$, R$^{13}$ and R$^{14}$ independently are hydrogen, C$_1$–C$_{12}$-alkyl, C$_1$–C$_4$-alkylthio, C$_1$–C$_4$-alkoxy, halogen or C$_2$–C$_6$-alkoxycarbonyl.

4. A photoinitiator mixture as claimed in claim 1, where the benzophenone derivatives b) are a mixture of from 60 to 95% by weight of benzophenone derivatives of the formula II and from 5 to 40% by weight of benzophenone derivatives of the formula III, based on the overall amount of benzophenone derivatives b).

5. A radiation-curable composition comprising at least one polymerizable, ethylenically unsaturated compound and a photoinitiator mixture as claimed in claim 1.

6. A radiation-curable composition as claimed in claim 5, comprising from 0.05 to 10 parts by weight of the photoinitiator mixture based on 100 parts by weight of polymerizable, ethylenically unsaturated compounds.

* * * * *